(12) United States Patent
Madara et al.

(10) Patent No.: US 7,788,940 B2
(45) Date of Patent: Sep. 7, 2010

(54) ELECTRONIC EQUIPMENT CABINET WITH INTEGRATED, HIGH CAPACITY, COOLING SYSTEM, AND BACKUP VENTILATION

(75) Inventors: Steven M. Madara, Columbus, OH (US); Steve Sillato, Westerville, OH (US); Thomas E. Harvey, Columbus, OH (US); David A. Dukes, Powell, OH (US)

(73) Assignee: Liebert Corporation, Columbus, OH (US)

( * ) Notice: Subject to any disclaimer, the term of this patent is extended or adjusted under 35 U.S.C. 154(b) by 528 days.

(21) Appl. No.: 11/458,732

(22) Filed: Jul. 20, 2006

(65) Prior Publication Data
US 2007/0030650 A1 Feb. 8, 2007

Related U.S. Application Data

(60) Provisional application No. 60/705,339, filed on Aug. 4, 2005.

(51) Int. Cl.
*F25D 23/12* (2006.01)
*F25D 17/00* (2006.01)
*H05K 5/00* (2006.01)
*H05K 7/20* (2006.01)

(52) U.S. Cl. ............... 62/259.2; 454/184; 361/695; 361/688; 62/333

(58) Field of Classification Search ............ 62/259.2, 62/186, 180, 441, 498; 236/49.3; 361/690, 361/695
See application file for complete search history.

(56) References Cited

U.S. PATENT DOCUMENTS 3,005,321 A * 10/1961 Devery .................. 62/186
3,253,646 A 5/1966 Koltuniak et al.

(Continued)

FOREIGN PATENT DOCUMENTS

DE 19804901 A 8/1999

(Continued)

OTHER PUBLICATIONS

Emerson Network Power—Liebert Foundation; "Protection for Today's Needs . . . and Tomorrow's Opportunities; Enclosure Systems", 2003, pp. 1-16.

(Continued)

*Primary Examiner*—Frantz F Jules
*Assistant Examiner*—Cassey Bauer
(74) *Attorney, Agent, or Firm*—Locke Lord Bissell & Liddell LLP (57) ABSTRACT

The disclosure provides an improved cooling system and associated cabinet for electronic equipment, and optionally, a backup ventilation system for cooling related failures. Generally, the disclosure includes a high capacity closed loop refrigeration system in a modified cabinet, while accommodating standard sized computer equipment. Further, the system provides directed heat removal by altering typical airflow paths within the cabinet. The backup ventilation system is powered by auxiliary power in the case of power failure and uses the same fan(s) for ventilation as is used for cooling. The disclosure provides a more efficient, higher capacity cooling cabinet in less space than otherwise known in the art. Further, the cooling system can anticipate heat loads and therefore operate in a predictive capacity by monitoring input power to the electronic equipment and adjusting the cooling for the expected increase or decrease in heat load generated based on the input power.

19 Claims, 5 Drawing Sheets

U.S. PATENT DOCUMENTS

| | | | |
|---|---|---|---|
| 3,317,798 A | 5/1967 | Chu et al. | |
| 3,334,684 A | 8/1967 | Roush et al. | |
| 3,749,981 A | 7/1973 | Koltuniak et al. | |
| 3,754,596 A | 8/1973 | Ward, Jr. | |
| 4,019,679 A | 4/1977 | Vogt et al. | |
| 4,238,933 A | 12/1980 | Coombs | |
| 4,240,499 A | 12/1980 | Kals | |
| 4,308,042 A | 12/1981 | Ecker | |
| 4,315,300 A | 2/1982 | Parmerlee et al. | |
| 4,495,780 A | 1/1985 | Kaneko et al. | |
| 4,514,746 A | 4/1985 | Lundqvist | |
| 4,756,164 A | 7/1988 | James et al. | |
| 4,911,231 A | 3/1990 | Horne et al. | |
| 5,035,628 A | 7/1991 | Casciotti et al. | |
| 5,054,542 A | 10/1991 | Young et al. | |
| 5,123,478 A | 6/1992 | Hosaka | |
| 5,150,277 A | 9/1992 | Bainbridge | |
| 5,161,087 A | 11/1992 | Frankeny et al. | |
| 5,220,809 A | 6/1993 | Voss | |
| 5,261,251 A | 11/1993 | Galiyano | |
| 5,273,438 A | 12/1993 | Bradley et al. | |
| 5,329,425 A | 7/1994 | Leyssens et al. | |
| 5,335,508 A | 8/1994 | Tippmann | |
| 5,376,008 A | 12/1994 | Rodriguez | |
| 5,395,251 A | 3/1995 | Rodriguez et al. | |
| 5,400,615 A | 3/1995 | Pearson | |
| 5,402,313 A | 3/1995 | Casperson et al. | |
| 5,410,448 A | 4/1995 | Barker et al. | |
| 5,414,591 A | 5/1995 | Kimura | |
| 5,467,607 A | 11/1995 | Harvey | |
| 5,471,850 A | 12/1995 | Cowans | |
| 5,522,452 A | 6/1996 | Mizuno et al. | |
| 5,570,740 A | 11/1996 | Flores et al. | |
| 5,603,375 A | 2/1997 | Salt | |
| 5,657,641 A | 8/1997 | Cunningham et al. | |
| 5,673,029 A | 9/1997 | Behl et al. | |
| 5,709,100 A * | 1/1998 | Baer et al. | 62/259.2 |
| 5,718,628 A | 2/1998 | Nakazato et al. | |
| 5,740,018 A | 4/1998 | Rambut, Jr. | |
| 5,847,927 A | 12/1998 | Minning et al. | |
| 6,024,165 A | 2/2000 | Melane et al. | |
| 6,026,891 A | 2/2000 | Fujiyoshi et al. | |
| 6,046,908 A | 4/2000 | Feng | |
| 6,115,242 A | 9/2000 | Lambrecht | |
| 6,148,626 A | 11/2000 | Iwamoto | |
| 6,158,502 A | 12/2000 | Thomas | |
| 6,167,948 B1 | 1/2001 | Thomas | |
| 6,185,098 B1 | 2/2001 | Benavides | |
| 6,205,796 B1 | 3/2001 | Chu et al. | |
| 6,205,803 B1 | 3/2001 | Scaringe | |
| 6,208,510 B1 | 3/2001 | Trudeau et al. | |
| 6,258,293 B1 | 7/2001 | Iizuka et al. | |
| 6,299,526 B1 | 10/2001 | Cowan et al. | |
| 6,305,180 B1 | 10/2001 | Miller et al. | |
| 6,310,773 B1 | 10/2001 | Yusuf et al. | |
| 6,416,330 B1 | 7/2002 | Yatskov | |
| 6,435,266 B1 | 8/2002 | Wu | |
| 6,515,862 B1 | 2/2003 | Wong | |
| 6,519,955 B2 | 2/2003 | Marsala | |
| 6,550,530 B1 | 4/2003 | Bilski | |
| 6,557,624 B1 | 5/2003 | Stahl et al. | |
| 6,564,858 B1 | 5/2003 | Stahl | |
| 6,579,168 B1 * | 6/2003 | Webster et al. | 454/184 |
| 6,628,520 B2 | 9/2003 | Patel et al. | |
| 6,644,384 B2 | 11/2003 | Stahl | |
| 6,679,081 B2 | 1/2004 | Marsala | |
| 6,742,345 B2 | 6/2004 | Carr | |
| 6,772,604 B2 | 8/2004 | Bash et al. | |
| 6,827,135 B1 | 12/2004 | Kramer et al. | |
| 6,881,141 B2 | 4/2005 | Knight | |
| 6,992,889 B1 | 1/2006 | Kashiwagi et al. | |
| 6,997,006 B2 * | 2/2006 | Kameyama et al. | 62/259.2 |
| 6,999,316 B2 | 2/2006 | Hamman | |
| 7,051,802 B2 | 5/2006 | Baer | |
| 7,236,359 B2 * | 6/2007 | Strobel | 361/687 |
| 7,469,555 B2 * | 12/2008 | Taras et al. | 62/513 |
| 2001/0042616 A1 | 11/2001 | Baer et al. | |
| 2001/0052412 A1 | 12/2001 | Tikka | |
| 2002/0039280 A1 | 4/2002 | O'Connor et al. | |
| 2002/0066280 A1 | 6/2002 | Ohkawara | |
| 2002/0117291 A1 | 8/2002 | Cheon | |
| 2002/0124585 A1 | 9/2002 | Bash et al. | |
| 2002/0184908 A1 | 12/2002 | Brotz et al. | |
| 2003/0010477 A1 | 1/2003 | Khrustalev et al. | |
| 2003/0051859 A1 | 3/2003 | Chesser et al. | |
| 2003/0126872 A1 | 7/2003 | Harano et al. | |
| 2003/0147216 A1 | 8/2003 | Patel et al. | |
| 2003/0182949 A1 | 10/2003 | Carr | |
| 2004/0025516 A1 | 2/2004 | Van Winkle | |
| 2004/0100770 A1 * | 5/2004 | Chu et al. | 361/698 |
| 2004/0184233 A1 | 9/2004 | Yamada | |
| 2005/0120737 A1 | 6/2005 | Borror et al. | |
| 2005/0168945 A1 | 8/2005 | Coglitore | |
| 2006/0101837 A1 * | 5/2006 | Manole | 62/259.2 |
| 2006/0102322 A1 | 5/2006 | Madara et al. | |

FOREIGN PATENT DOCUMENTS

| | | |
|---|---|---|
| DE | 29908370 U1 | 9/1999 |
| EP | 1357778 A2 | 10/2003 |
| GB | 2113012 A | 7/1983 |

OTHER PUBLICATIONS

Emerson Network Power—Liebert Foundation; Wall Mount Equipment Enclosures Designed for Tight Spaces; 2003, pp. 1-2.

International Search Report for International Patent Application No. PCT/US2006/028088.

Written Opinion of the International Searching Authority for International Patent Application No. PCT/US2006/028088.

Baer, D.B. "Emerging Cooling Requirements & Systems in Telecommunications Spaces." Telecommunications Energy Conference 2001, Oct. 14-18, 2001, p. 95-100.

Vogel, Marlin et al. "Low Profile Heat Sink Cooling Technologies for Next Generation CPU Thermal Designs." Electronic Cooling Online, Feb. 17, 2005, 11 pages.

Webb, Warren. "Take the heat: Cool that hot embedded design." EDN, May 13, 2004, 5 pages.

JAMSTEC/Earth Simulator Center, "Processor Node (PN) Cabinet." one page. http://www.esjamstec.go.jp/esc/eng/Hardware/pnc.html [accessed Mar. 5, 2004].

Hannemann, Robert et al. "Pumped Liquid Multiphase Cooling." ASME, 2004, IMECE 2004, Paper IMECE2004-60699, Anaheim, California, 5 pages.

"Thermal Form & Function—Rack Cooling System (RCS)." Thermal Form & Function LLC, 2005, Manchester, MA, one page. http://www.thermalformandfunction.com/racksystem.html [accessed May 11, 2006].

Pitasi, M. "Thermal Management System Using Pumped Liquid R-134a with Two Phase Heat Transfer." Thermal Form & Function LLC, Mar. 2002, Manchester, MA, pp. 1-9. http://www.coolingzone.com/Guest/News/NL_MAR_2002/TFF/Tff.html.

Marsala, Joe. "Pumped Liquid/Two Phase Cooling for High Performance Systems." Thermal Form & Function LLC, May 13, 2003, Scottsdale, Arizona, 19 pages.

"Managing Extreme Heat Cooling Strategies for High-Density Computer Systems." Liebert Corporation, Dec. 7, 2003, Columbus, Ohio, 16 pages.

Klingeberg, G. "Kombination Spart Strom bei der Schaltschrankklimatisierung." Elekotrotechnik, Vogel Verley K. G., Wurzburg DE, Nov. 5, 1998.

European Search Report for Counterpart EPO04812840, Jul. 6, 2007, 3 Pages.

International Search Report for Corresponding International Patent Application No. PCT/US2005/040745.

Written Opinion of the International Searching Authority for Corresponding International Patent Application No. PCT/US2005/040745.

International Search Report for Corresponding International Patent Application No. PCT/US2004/040407.

Written Opinion of the International Searching Authority for Corresponding International Patent Application No. PCT/US2004/040407.

European Communication for European Patent Application No. 04812840.9.

Pearson, S.F. et al., "Development of Improved Secondary Refrigerants." The Proceedings of The Institute of Refrigeration, vol. 89, pp. 65-80, 1992, United Kingdon.

* cited by examiner

ELECTRONIC EQUIPMENT CABINET WITH INTEGRATED, HIGH CAPACITY, COOLING SYSTEM, AND BACKUP VENTILATION

CROSS-REFERENCE TO RELATED APPLICATION

This patent claims the benefit of U.S. Provisional Appl. No. 60/705,339 filed Aug. 4, 2005.

FIELD

The present invention relates generally to electronic equipment cabinets and housings, and, more particularly to electronic equipment cabinets having cooling systems.

BACKGROUND

Figure 1:
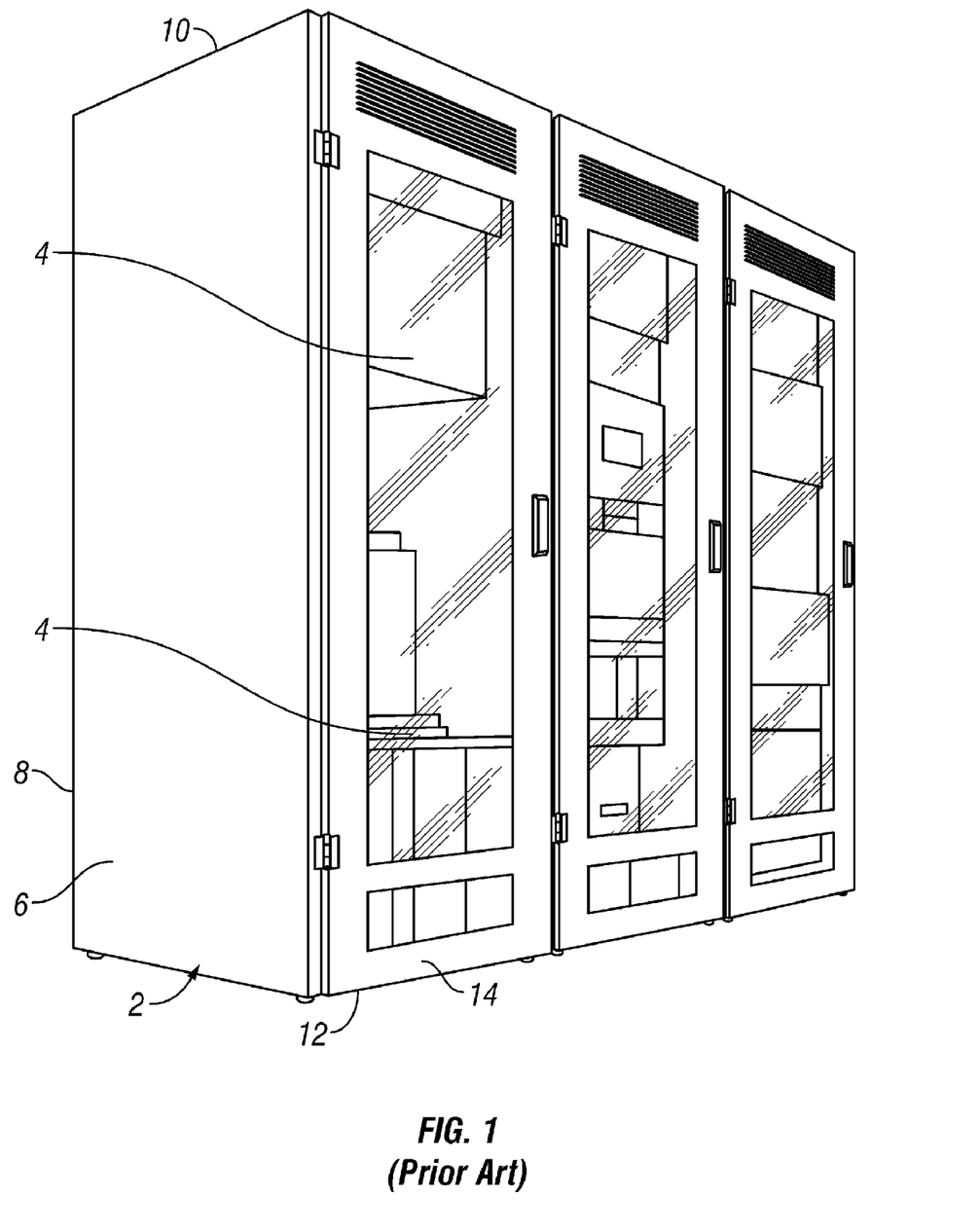
FIG. 1 is a perspective view of an existing stack of cabinets to support electronic equipment.

With the expansion of telecommunication and computer technology, increasing amounts of electronic equipment are required at businesses and other facilities. Large amounts of electronic equipment are often stored in a room devoted to that purpose. As shown in FIG. 1, the equipment is generally organized in a cabinet 2 of standard dimensions with multiple horizontal trays 4 to support multiple rows of equipment. The cabinet 2 generally includes sides, 6, back 8, top 10, bottom 12, and a door 14 to gain access to the equipment therein. Power rails, uninterruptible power supplies, and other features can be included. This equipment generates heat, which must be removed from the room in order to maintain stable conditions in the rooms. Because advances in technology have lead to an increased density of the amount of electronic equipment that can be provided in a set amount of space, it has become increasingly difficult to remove this heat by means of the conventional room air conditioning alone. Therefore, it is often necessary to install localized cooling for the cabinets that house this electronic equipment.

General purpose cooling systems for rooms and open spaces are often inadequate for single racks of critical electronic equipment. Cooling systems designed for room size data centers may be adequate for overall critical equipment needs in the data centers, but are often too large for single stacks of equipment in a single cabinet. Such cooling systems generally use an external connection for heat rejection, for example, with chilled water or a cooling tower.

Some existing commercial suppliers have provided a closed loop refrigerated cooling system coupled to the cabinets. The refrigeration system typically includes a compressor for compressing refrigerant in the system to an elevated pressure, a condenser to cool the refrigerant that is heated by the act of compression, an expansion device that thermodynamically cools the refrigerant, an evaporator that is cooled by the cooled refrigerant flowing therethrough, a fan to move air across the evaporator's surfaces to cool the air whereby the refrigerant in turn absorbs heat from the warmer air, various refrigeration lines for carrying the refrigerant between the components, and a system controller, such as a thermostat. These systems are generally mounted in the bottom or on top of the cabinet. A typical cabinet is about 24" wide and 78" to 84" high. The cooling module can consume about 12"-15" in the bottom of the cabinet or add such amount to the overall height if mounted on top of the cabinet.

While these systems have been well received in the marketplace, they were designed for cooling capacities of electronic equipment up to about 3.0 KW. The cooling capacity of these existing electronic equipment cabinets with self-contained cooling solutions are insufficient for some newer computing devices, which consume more power and produce higher levels of heat. Some of the power requirements require a cooling capacity many times the existing amounts approaching an order of magnitude change, such as 10 KW to 15 KW. Simply making the cooling system bigger would consume about half of the cabinet space or, if mounted on the top, would cause clearance problems with room ceilings—both commercially unsatisfactory solutions.

Also, existing computer equipment cabinets with built-in cooling coils and fans do not provide satisfactory means of ventilation when the cooling system fails. These existing solutions typically use cabinet doors designed to open outwardly automatically for ventilation if there is a failure in the cooling system. However, such systems are subject to doors being blocked, rendering the emergency cooling means ineffective. One known backup solution is mounted to a vertical portion of the cabinet with a damper that opens inwardly. Air flows downwardly, across the bottom of the unit, up the wall opposite the entering wall, across the top, down the entering wall, and out an exit. The damper is limiting and the length of the airflow causes inefficient removal of the generated heat.

Another challenge with existing electronic equipment cabinets with built-in cooling coils and fans is that they typically do not respond quickly to large, instantaneous changes in heat load. The cooling system senses the heat after the heat has been generated and then attempts to compensate by extra cooling to lower the temperature back down to an intended set point. The cooling system is therefore responsive to thermal heat after it has been produced. The result can be a wide fluctuation of temperatures in the cabinet, as the cooling system's control system responds to the load change.

Therefore, there remains a need for an improved cooling system for electronic equipment cabinets.

SUMMARY

The disclosure provides an improved cooling system and associated cabinet for electronic equipment, and optionally, a backup ventilation system for power failures and other cooling related failures. Generally, the disclosure includes a high capacity closed loop refrigeration system in a modified cabinet, while accommodating standard sized computer equipment. Further, the system provides directed heat removal by altering typical airflow paths within the cabinet. The backup ventilation system can be powered by auxiliary power in the case of power failure and uses the same fan(s) for ventilation as is used for cooling. The disclosure provides a more efficient, higher capacity cooling cabinet in less space than otherwise known in the art. Further, the cooling system can anticipate heat loads and therefore operate in a predictive capacity by monitoring input power to the electronic equipment and adjusting the cooling for the expected increase or decrease in heat load generated based on the input power.

The disclosure provides a cooling system for electronic equipment, comprising: a closed loop refrigeration system comprising a compressor, a condenser coupled to the compressor, an expansion device coupled to the condenser, an evaporator coupled to the expansion device and to the compressor, and a cooling system controller adapted to control operation of the refrigeration system, the refrigeration system being coupled to the cabinet; a cabinet having a width, depth, and height, the cabinet comprising: a first portion having a plurality of horizontal spaces adapted to contain electronic equipment; and a second portion extending at least partially along the height of the cabinet and adapted to house the evaporator, wherein the evaporator extends at least partially along the height; and at least one fan adapted to flow air through a first flow path through the evaporator in a circumferential horizontal direction around at least a partial periphery of the first portion and through the second portion.

The disclosure also provides a method of controlling temperature in an electronic equipment cabinet having a closed loop refrigeration system coupled thereto, comprising: compressing and heating a refrigerant in the closed loop refrigeration system coupled to the cabinet; flowing the refrigerant into a condenser of the refrigeration system; flowing the refrigerant through an expansion device to cool the refrigerant; flowing the refrigerant through an evaporator and flowing air across surfaces of the evaporator to cool the air and heat the refrigerant; flowing the cooled air into the cabinet through a first flow path having a plurality of horizontal flow streams at different elevations in the cabinet across heated surfaces of the electronic equipment, the cooled air flowing in a circumferential horizontal direction around a periphery of the cabinet; and returning at least a portion of the refrigerant for compressing.

BRIEF DESCRIPTION OF THE DRAWINGS

A more particular description, briefly summarized above, may be had by reference to the embodiments illustrated in the appended drawings, forming part of the present specification and described herein. It is to be noted, however, that the appended drawings illustrate only some embodiments described herein and are therefore not to be considered limiting of the disclosure's scope, in that there can be other equally effective embodiments.

DETAILED DESCRIPTION

Figure 2:
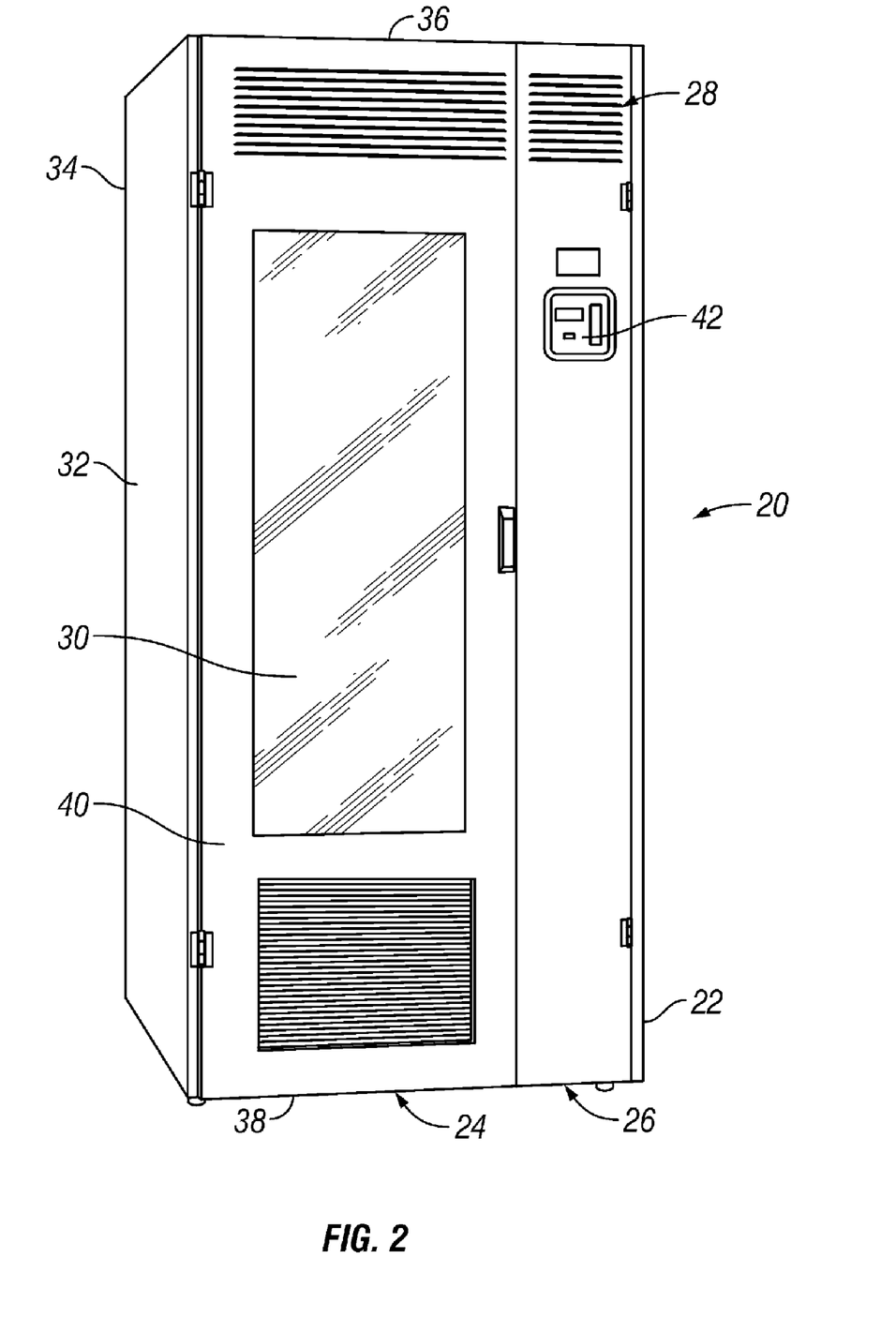
FIG. 2 is a schematic frontal perspective view of an exemplary embodiment of a cooling system for electronic equipment, according to the present disclosure.

FIG. 2 is a schematic frontal perspective view of an exemplary embodiment of a cooling system for electronic equipment, according to the present disclosure. A cooling system 20 for electronic equipment generally includes a cabinet to support the electronic equipment and a refrigeration system described with its various elements below.

The cabinet 22 can include a first portion 24 to support the equipment, a second portion 26 to enclose a portion of the refrigeration system such as a compressor and an evaporator, and a third portion 28 that can include a condenser and an exhaust fan. In at least one embodiment, the second portion is disposed horizontally to the first portion, such as to the side, and the third portion is disposed vertically to the first portion, such as above the first portion. The first portion 24 generally includes a series of horizontal spaces 30 disposed in the cabinet. The horizontal spaces can be pre-assembled with various racks and trays for mounting equipment, circuit boards, and other electronic equipment. Alternatively, the horizontal spaces 30 can include mounting brackets and runners with, for example, pre-drilled openings to mount equipment. The cabinet 22 generally includes sides 32, a back 34, a top 36, a bottom 38, and a door 40 to gain access to the electronic equipment disposed therein. The door can include a security latch for restricted access. The system 20 can include a system indicator 42. The system indicator 42 monitors, for example, temperature, humidity, voltage, and/or other operating aspects of the system 20 as may be desired. It can provide input to a system controller to control at least some of the conditions.

Figure 3:
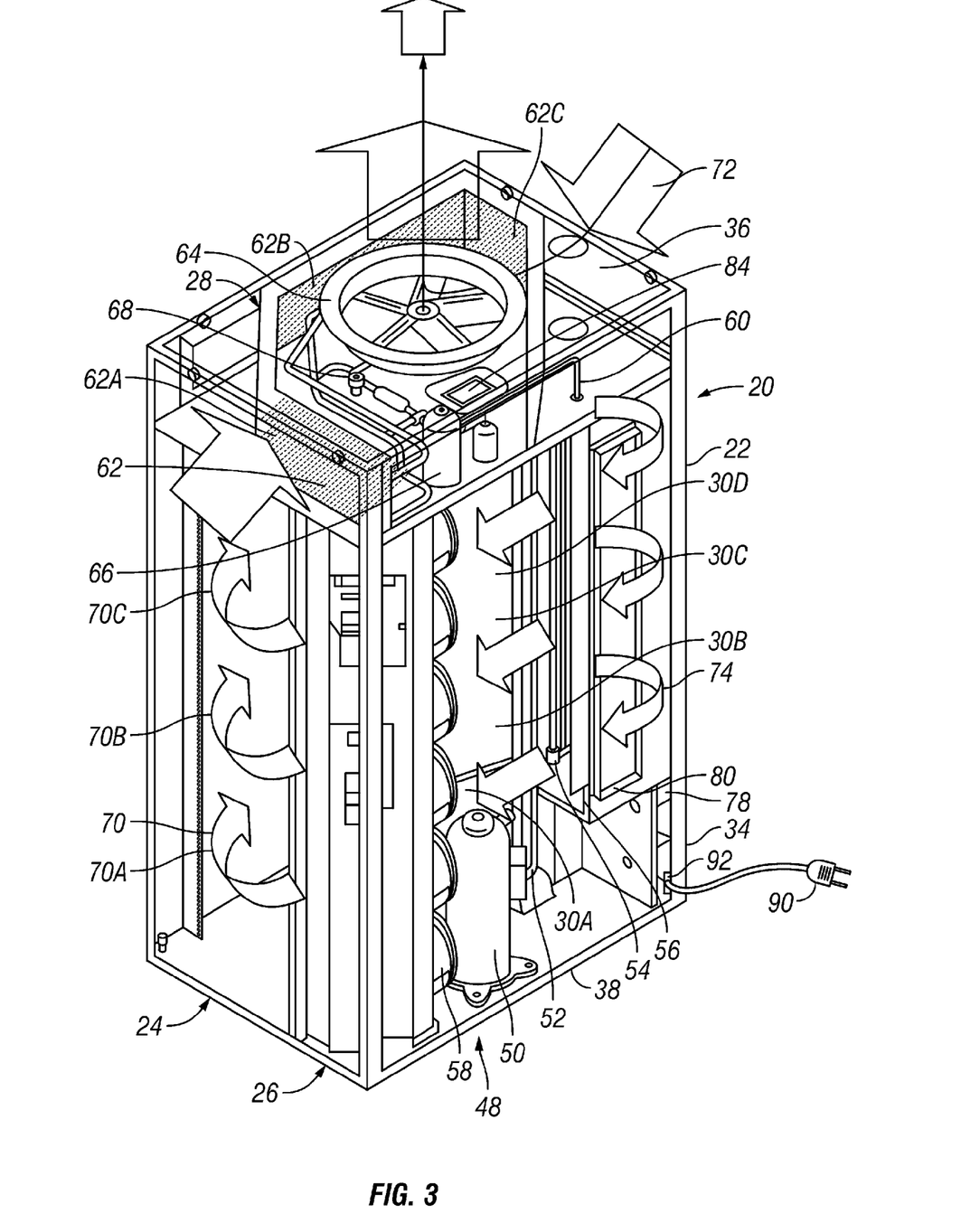
FIG. 3 is a schematic frontal perspective view of different flow paths and elements of the cooling system of FIG. 2.

FIG. 3 is a schematic frontal perspective view of different flow paths and elements of the cooling system of FIG. 2. The cooling system 20 includes a first portion 24, a second portion 26, and a third portion 28. The first portion 24 contains and supports the electronic equipment exposed therein. The first portion 24 can include one or more horizontal spaces 30A, 30B, 30C, 30D. The horizontal spaces are generally used to mount electronic equipment in a horizontal fashion thereon. The second portion 26 includes various refrigeration equipment and helps establish a first flow path 70 described below. The third portion 28 is used to flow air through a condenser and for exhaust from the system 20 of the condenser air.

The refrigeration system 48 generally includes a series of components coupled together that use a refrigerant in a closed loop refrigeration cycle. The refrigeration system 48 can include a compressor 50, a condenser 62 coupled to the compressor, an expansion device 54 coupled to the condenser, an evaporator 56 coupled on an inlet port to the expansion device and coupled on an output port to the compressor. The various components of the refrigeration system can be coupled together through intermediate refrigeration lines, such as refrigeration lines 52, 60, and other lines as appropriate that flow the refrigeration therebetween. The system can further include a fan 58 for moving air through the evaporator, an exhaust fan 64 for moving air through the condenser, and a controller 66 with one or more valves 68 for flow control of refrigerant. The term "coupled," "coupling," and like terms are used broadly herein and can include any method or device for securing, binding, bonding, fastening, attaching, joining, inserting therein, forming thereon or therein, communicating, or otherwise associating, for example, mechanically, fluidicly, magnetically, electrically, chemically, directly or indirectly with intermediate elements, one or more pieces of members together and can further include integrally forming one functional member with another in a unitary fashion.

In at least one embodiment, the compressor 50 can be disposed in the second portion 26. In addition to being compactly installed therein, the cooled air in the second portion flowing past the compressor during operation can help cool the compressor. The compressor can be a fixed displacement compressor or advantageously a variable flow compressor, sometimes referred to as a modulated or digital scroll compressor. The variable flow compressor can allow the cooling system 20 to operate more efficiently in that the compressor can be modulated more closely to variable load conditions. For example, the modulation can be controlled by controlling the duty cycle of the compressor with a bypass valve that opens and closes to at least partially bypass the compression stage of the compressor.

The condenser 62 is used to cool the refrigerant, heated by the compressor compressing the refrigerant. Generally, a second flow path 72 (a first flow path 70 being through the evaporator as described below) is established through the condenser by flowing air or other fluid across its surfaces and through an exhaust fan 64. The condenser 62 can be subdivided into one or more modules, so that refrigerant can be selectively controlled to each of the modules to control the amount of cooling from the refrigerant and hence head pressure on the refrigeration system. The condenser 62 can include, therefore, modules 62A, 62B, 62C.

The expansion device 54, such as an expansion valve, can expand the refrigerant to a lower pressure and thermodynamically cool the refrigerant. The cooled refrigerant flows from the expansion device to the evaporator 56. The evaporator 56 is generally a heat exchanger that allows cool refrigerant flowing internally to the evaporator to cool warmer air or another medium flowing across the evaporator external surfaces. Conversely, the flowing medium transfers its higher heat into the refrigerant. In at least one embodiment, the evaporator 56 can be mounted vertically along the height of the cabinet 22, so that air flows past the surfaces of the evaporator horizontally to align with the one or more fans.

The air flowing past the evaporator 56 can enter an intake of one or more fans 58. The fans 58 can then increase velocity of the flow toward a periphery of the cabinet 22 and particularly the first portion 24. Further, the velocity from various fans can be varied, for example, by installing higher flow rate fans or otherwise controlling the fans' capacities in particular areas that may generate more heat. For example, a higher flow rate fan near the upper portion of the cabinet may be appropriate where higher temperatures may exist. The flow path through the evaporator 56 and the fans 58 around at least the periphery of the cabinet 22 establishes a first flow path 70. When the air is flowing at different elevations, for example, by using a plurality of fans, the first flow path can be divided into flow paths 70A, 70B, and 70C, and others. The air can also flow through various interior portions of the first portion 24 across the electronic equipment.

Figure 5:
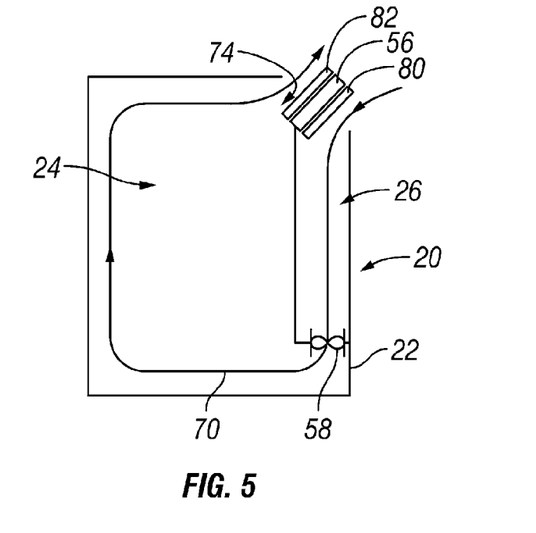
FIG. 5 is a schematic top view of an exemplary flow path in the cooling system through a horizontal cross section of the embodiment shown in FIG. 4.

The evaporator 56 can be installed at a turn 74 in the first flow path, such as in a corner of the cooling system 20. Generally, the evaporator will be sealingly disposed across the flow path of the second portion 26. Installing the evaporator at the turn can advantageously accomplish at least two benefits. First, when the air turns, its velocity generally decreases due to turbulence and friction. The decreased velocity allows a longer contact time of the air with the cooled evaporator to transmit further cooling into the air. Secondly, the evaporator can be wider by being mounted across the hypotenuse of a triangle (as shown in FIG. 5) and offer additional surface area by mounting it at the turn of the airflow. The refrigerant, heated after passing through the evaporator, flows to the compressor 58 for recompression.

A controller 66 can be used to control the flow of refrigerant through the system, the operation of the compressor, the operation of the fans, and other operational factors. Further, the controller 66 can control one or more valves, such as valve 68, that control the flow of refrigerant through the condenser and particularly through one or more of the condenser modules.

One or more dampers can be included in the cooling system 20 to adjust the first and/or second flow paths. A first damper 80 can be installed in the first flow path 70 to allow fresh air into the first flow path as required. For illustrative purposes, the damper 80 is shown partially open with the edge of the evaporator 56 shown behind it. The relative positions are further seen in FIG. 5. The damper 80 can be mounted in proximity to the evaporator 56 at the turn 74. A second damper 82 described in reference to FIG. 4 can be mounted on an opposite flow side of the evaporator 56 from the first damper 80. The second damper 82 can allow exhausting of the air flowing through the cooling system 40 in the first flow path 70.

Advantageously, the first and second dampers 80, 82 can be opened when main power to the cooling system is off, such as in a power failure, when the refrigeration system malfunctions, or other impediments to the cooling system's ability to cool under normal operating conditions (herein "cooling related failures"). The opening of one or more of the dampers can allow ambient air into the cabinet for some measure of cooling in such an event. Further, auxiliary power supply 78, such as an uninterruptible power supply, can provide power to one or more of the fans 58, 64 to provide continued circulation of air during the power failure or other cessation of power to the cooling system 20. An alternative first damper 84 can be disposed between the first portion 24 and the third portion 28 in conjunction with an alternative second damper 94, shown in FIG. 6. The dampers 84, 94 can further be designed to open during a power failure and allow air to escape the first portion 24 through third portion 28. Further, the exhaust fan 64, coupled to the auxiliary power supply, can assist in evacuating warm air from the first portion 24 during such power failure or at other times.

The cooling system 20 can further include a line power monitor 92. The line power monitor 92 can monitor incoming power from a main line 90 that provides main power to the power outlets in the cabinet for the various electronic equipment disposed therein, and to the cooling system 20. Advantageously, the line power monitor 92 can use changes in power flowing through the main line 90 to anticipate heat loads. For example, if an operating conditions occurs that requires more power by the electronic equipment, it will have a direct correlation on the amount of heat generated by the electronic equipment. The line power monitor 92 can signal such a change to the system controller 66 in anticipation of the heat load and increase the cooling capacity before the heat increase is actually sensed. In some embodiments, the signal from the line power monitor 92 can override a standard operating condition established in the cabinet through the controller 66, such as one based on temperature in the cabinet. Conversely, the line power monitor 92 can signal when a reduced load occurs and provide such input to the system controller to decrease cooling capacity. Such variations in operating conditions can further be modulated when using a variable capacity compressor, described above.

Figure 4:
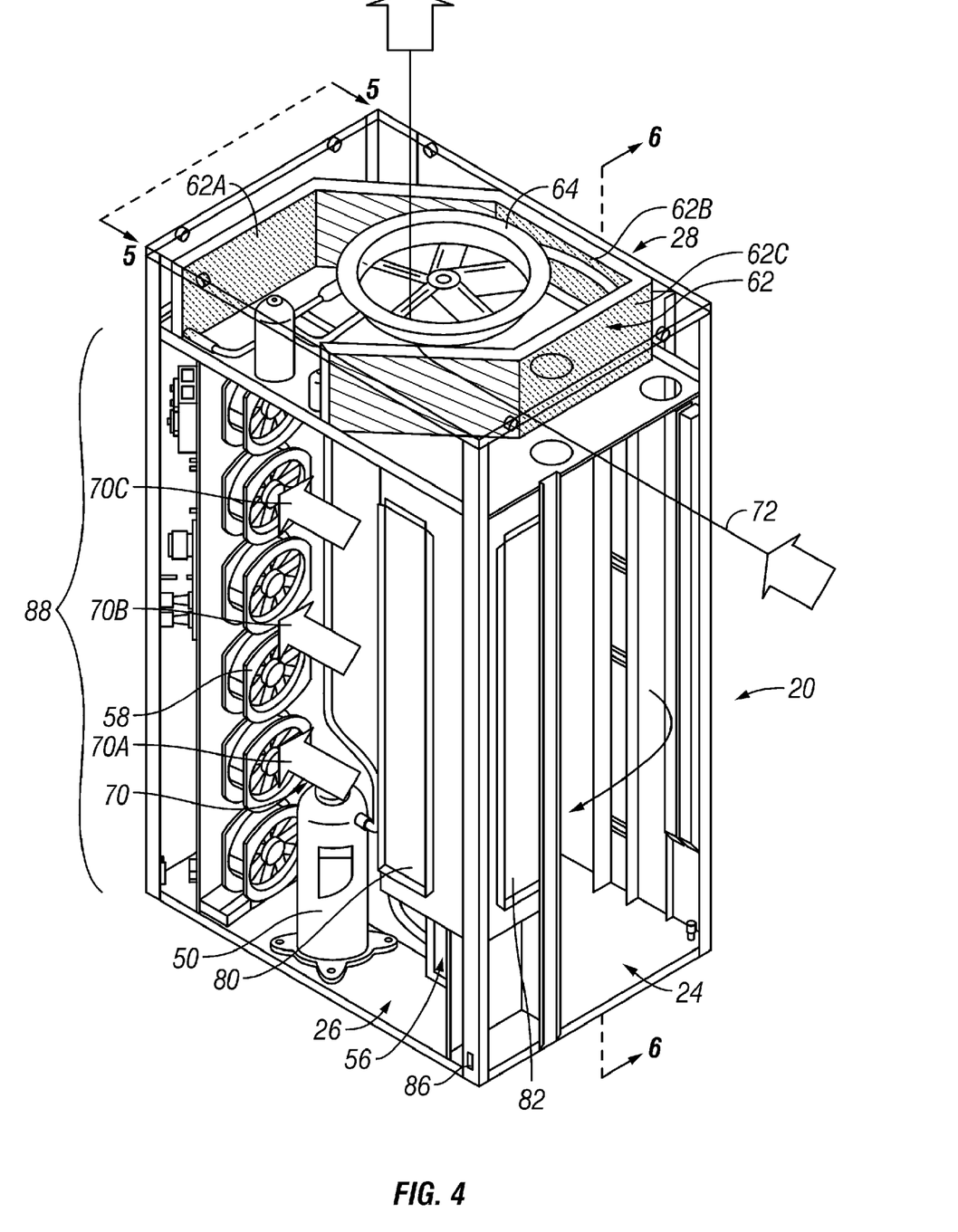
FIG. 4 is a schematic rearward perspective view of different flow paths and elements of the cooling system.

FIG. 4 is a schematic rearward perspective view of different flow paths and elements of the cooling system. Similar to FIG. 3 but from a different viewpoint, a first flow path 70 is established through the cooling system 20 that flows through the second portion 26 and around a periphery of the first portion 24. The compressor 50 can be mounted in the second portion along with refrigerant lines and the evaporator 56 (disposed behind the dampers 80, 82 in this view). For example, the evaporator can be mounted in a corner 86 of the cooling system 20 where a turn in the flow direction of the first flow path 70 occurs.

The system discloses a highly efficient cooling system 20 that alters the typical flow path in such cabinets. Generally, existing cooling systems for electronic cabinets include a single main fan that flows air into the cooling system in a generally vertical direction that disperses across the various horizontal elevations, while incrementally losing heat as it flows vertically. Thus, some horizontal zones receive less cooling than others. Further, the return flow path is generally along a vertical surface distal from the first vertical surface where incoming air can be mixed with outgoing air through such a long return flow path.

The present invention alters the flow paths in such a way to relatively quickly supply cool air to the horizontal surfaces in a more direct fashion. Further, the present disclosure can provide for a plurality of fans 58 at various elevations that can provide more intense and directed horizontal flow through the unit. The horizontal flow through the unit across the horizontal trays and horizontally mounted equipment is a relatively short direct path from the evaporator to the fans to the equipment. With a plurality of fans, such as stacked above each other, it is believed that a somewhat laminar airflow develops through at least a portion of the cabinet. Further, the cooling system allows for a generally larger evaporator with small space requirements (i.e., small footprint) by using a generally vertically oriented evaporator along the height of the cabinet and yet still direct flow therethrough to correspond with the desired horizontal flow.

FIG. 5 is a schematic top view of an exemplary flow path in the cooling system through a horizontal cross section of the embodiment shown in FIG. 4. The cooling system 20 generally flows air through the second portion 26 by flowing through the evaporator 56, through the fan 58, around the periphery of the first portion 24, and back through the evaporator 56 to establish the first flow path 70. For efficiency, the evaporator 56 can be mounted at a turn 74 in the flow path 70. Under other operating conditions, such as providing fresh air, one or more of the dampers 80, 82 can open. Under such circumstances, if both dampers 80, 82 were open the first flow path 70 would include air entering through the first damper 80, circulating through the fan 58, around the periphery of the first portion 24, and out the second damper 82. Advantageously, an auxiliary power supply (shown in FIG. 3) can provide power to the one or more fans 58 to help circulation through the cabinet, when the main power is off. The position of the first and/or second dampers 80, 82 can restrict flow across the evaporator 56 to encourage separation between the incoming air and the outgoing air.

Figure 6:
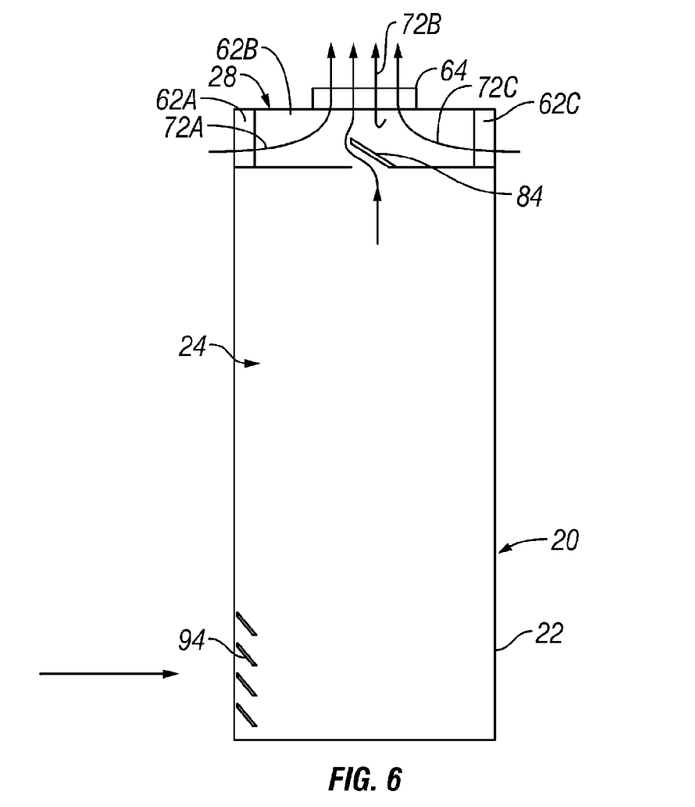
FIG. 6 is a schematic side view of an alternate exhaust flow path in the cooling system through a vertical cross section of the embodiment shown in FIG. 4.

FIG. 6 is a schematic side view of an alternate exhaust flow path through a vertical cross section of the embodiment shown in FIG. 4. The condenser 62 can include one or more condenser modules 62A, 62B, 62C for different operating conditions. For example, high heat loads may require refrigerant flow through all modules, and low heat loads may require only one module. The flow of refrigerant to each of the condenser modules can be turned on or off to maintain the desired conditions and resultant head pressure on the refrigeration system. This control can be accomplished by valves, such as solenoid valves and check valves, on various refrigeration lines to the condenser and/or condenser modules.

The second flow path 72 can include exemplary flow path segments 72A, 72B, 72C that correspond with flow through the exemplary condenser modules 62A, 62B, 62C. Generally, the segments will converge and be exhausted through the exhaust fan 64.

Under some operating conditions, such as a power outage, an alternative first damper 84 can be disposed to automatically open and allow a flow path between the first portion 24 and the third portion 28. An alternative second damper 94 can allow air or other another medium to flow into the first portion 24. The air or other medium can flow through the first damper 84 into the third portion 28 to be exhausted therefrom. Further, auxiliary power can be provided to the exhaust fan 64, such as through an uninterruptible power supply, generator, or other device to encourage the flow path therethrough.

The condenser, exhaust fan, valves, and associated hardware can be mounted in the third portion 28 above the first portion 24 of the cabinet 22. In other embodiments, the third portion 28 can be located remote from the first portion 24, such as the condenser 62 being located external to a room containing the cabinet 22. Still further, the condenser 62 can be a liquid-liquid type condenser that is cooled by a liquid such as water and glycol mixtures through a separate flow path in the condenser isolated from the refrigerant. In turn, the liquid can be then cooled by a second condenser (not shown), such as external air-cooled condenser coupled to the separate flow path.

The various steps described or claimed herein can be combined with other steps, can occur in a variety of sequences unless otherwise specifically limited, various steps can be interlineated with the stated steps, and the stated steps can be split into multiple steps. Unless the context requires otherwise, the word "comprise" or variations such as "comprises" or "comprising", should be understood to imply the inclusion of at least the stated element or step or group of elements or steps or equivalents thereof, and not the exclusion of any other element or step or group of elements or steps or equivalents thereof. Also, any directions such as "top," "bottom," "left," "right," "upper," "lower," and other directions and orientations are described herein for clarity in reference to the figures and are not to be limiting of the actual device or system or use of the device or system. The device or system may be used in a number of directions and orientations.

The invention has been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intends to protect all such modifications and improvements to the full extent that such falls within the scope or range of equivalent of the following claims.

Further, any documents to which reference is made in the application for this patent as well as all references listed in any list of references filed with the application are hereby incorporated by reference. However, to the extent statements might be considered inconsistent with the patenting of this invention such statements are expressly not to be considered as made by the Applicants.

What is claimed is:

1. An electronic equipment cabinet, comprising:
    a cabinet configured to operatively house a plurality of electronic equipment, at least a portion of a primary cooling system and a backup cooling system, the cabinet securable against unwanted access to the electronic equipment;
    the primary cooling system comprising:
        a compressor;
        an evaporator within the cabinet;
        at least one fan within the cabinet for moving air along a primary cooling flow path through the evaporator and across the electronic equipment;
        a condenser; and
        a refrigerant,
        all operatively coupled in closed-loop fashion and configured to reject heat from within the cabinet to outside the cabinet;
    the backup cooling system comprising:
        at least one backup cooling damper associated with the cabinet and configured to seal against ambient air flow there through during operation of the primary cooling system and to automatically open upon a cooling related failure in the primary cooling system; and
        a control system configured to, upon the cooling related failure, open the damper and energize the at least one evaporator fan thereby drawing ambient air from outside the cabinet through the damper and into the cabinet along a backup cooling path to cool the electronic components;

wherein the backup cooling damper closes off the evaporator so that the backup cooling air flow path within the cabinet comprises flowing air across the electronic components but not through the evaporator.

2. The cabinet of claim 1, wherein the control system is configured to control one or more operational factors selected from the group consisting of: operation of the compressor; operation of the at least one fan; operation of a condenser valve; and operation of the damper.

3. The cabinet of claim 1, wherein the backup cooling system further comprises:
a power supply operatively coupled to the fan and the control system, and configured to provide power to the fan upon the cooling related failure.

4. The cabinet of claim 3, wherein the power supply is an uninterruptible power supply.

5. The cabinet of claim 1, wherein the cooling related failure comprises a failure of a primary cooling system component.

6. The cabinet of claim 1, wherein the cooling related failure comprises an electrical power failure.

7. The cabinet of claim 1, wherein the control system is configured to establish the backup cooling air flow path on the cooling related failure.

8. The cabinet of claim 7, wherein the fan is configured to move air through the second air flow path when the damper is open.

9. The cabinet of claim 1, wherein the compressor is located at least partially within the primary cooling air flow path.

10. The cabinet of claim 1, wherein the electrical equipment comprise standard-sized computer equipment.

11. The cabinet of claim 1, further comprising:
an exhaust fan configured to flow air heated by the electrical equipment across the condenser.

12. The cabinet of claim 11, wherein the control system energizes the exhaust fan on the cooling related failure.

13. The cabinet of claim 1, wherein the condenser is not within the cabinet.

14. The cabinet of claim 1, wherein the cabinet includes a first portion housing the electronic equipment and a second portion housing the condenser, such that the condenser is not within the portion of the cabinet housing the electronic equipment.

15. The cabinet of claim 1, wherein the cabinet includes a first portion housing the electronic equipment, a second portion housing the compressor and the evaporator, and a third portion housing the condenser.

16. The cabinet of claim 15, wherein the portions are divided by partitions.

17. The cabinet of claim 15, wherein the at least one fan of the primary cooling system includes a plurality of vertically spaced fans configured to establish the primary cooling flow path between the first portion and the second portion.

18. The cabinet of claim 17, wherein the primary cooling flow path is substantially horizontal throughout both the first and second portions.

19. The cabinet of claim 17, the cabinet further including an exhaust fan to establish a secondary air flow path through the condenser, the secondary air flow path being separate from the primary cooling flow path.

* * * * *